United States Patent [19]
Johnsen et al.

[11] Patent Number: 5,023,196
[45] Date of Patent: Jun. 11, 1991

[54] METHOD FOR FORMING A MOSFET WITH SUBSTRATE SOURCE CONTACT

[75] Inventors: Robert J. Johnsen; Paul W. Sanders, both of Scottsdale, Ariz.

[73] Assignee: Motorola Inc., Schaumburg, Ill.

[21] Appl. No.: 471,899

[22] Filed: Jan. 29, 1990

[51] Int. Cl.[5] .............................................. H01L 21/44
[52] U.S. Cl. ...................................... 437/40; 437/203; 437/913; 148/DIG. 168
[58] Field of Search ................. 437/40, 203, 913, 915, 437/981; 148/DIG. 168; 357/23.7

[56] References Cited

U.S. PATENT DOCUMENTS

| | | | |
|---|---|---|---|
| 4,374,455 | 2/1983 | Goodman | 437/913 |
| 4,398,339 | 8/1983 | Blanchard et al. | 437/913 |
| 4,683,643 | 8/1987 | Nakajima et al. | |
| 4,694,561 | 9/1987 | Lebowitz | |
| 4,713,678 | 12/1987 | Womack et al. | |
| 4,738,936 | 4/1988 | Rice | 437/40 |
| 4,767,722 | 8/1988 | Blanchard | 437/913 |
| 4,797,373 | 1/1989 | Malhi et al. | |
| 4,824,793 | 4/1989 | Richardson et al. | |
| 4,859,621 | 8/1989 | Einthoven | 148/DIG. 168 |

FOREIGN PATENT DOCUMENTS

| | | | |
|---|---|---|---|
| 2487583 | 1/1982 | France | 437/913 |
| 57871 | 5/1979 | Japan | 437/913 |
| 83944 | 7/1981 | Japan | 437/913 |
| 175457 | 9/1985 | Japan | 437/913 |
| 182774 | 9/1985 | Japan | 437/913 |
| 2034114 | 5/1980 | United Kingdom | 437/40 |

Primary Examiner—Brian E. Hearn
Assistant Examiner—Linda J. Fleck
Attorney, Agent, or Firm—Robert M. Handy; Joe E. Barbee

[57] ABSTRACT

A MOSFET having a back-side source contact and top-side gate and drain contacts is provided by a structure comprising superposed N+, N−, P−, N+ regions arranged between top and bottom surfaces of the semiconductor die. In a preferred implementation, two trenches are etched from the top surface to the P−, N+ interface. A buried P−, N+ short is provided in one trench and a gate dielectric and gate electrode are provided over the sidewall P− region exposed in the other trench. This creates a vertical MOSFET in which the N+ substrate forms the source region shorted to the P− body region in which the channel is created by the gate. Superior performance is obtained in RF grounded-source circuit applications.

10 Claims, 4 Drawing Sheets

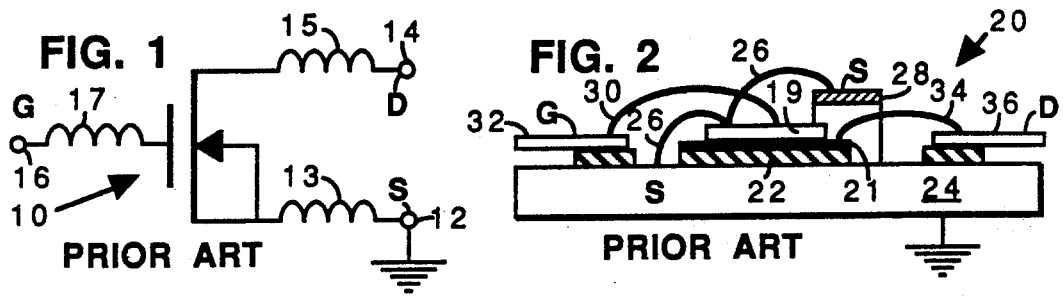
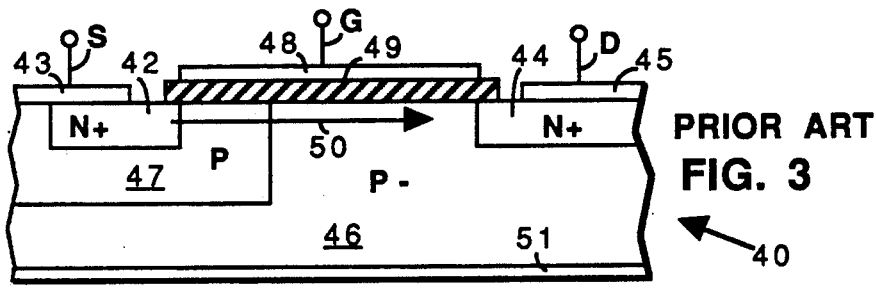
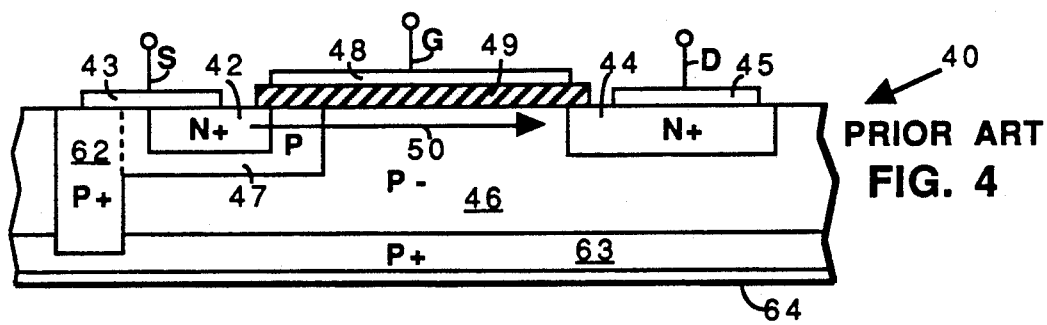
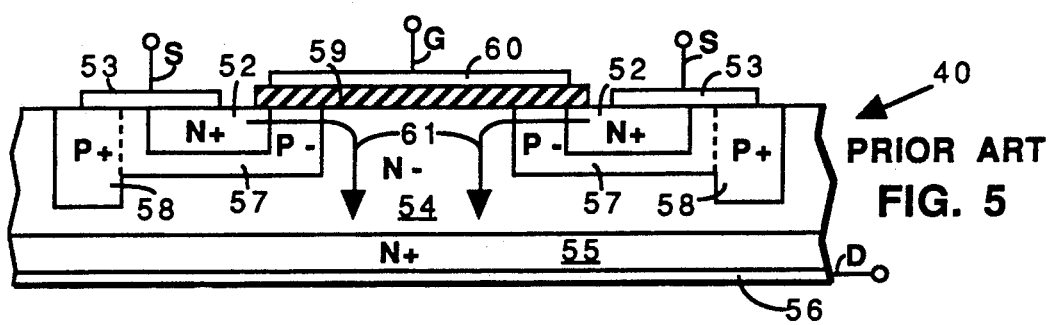
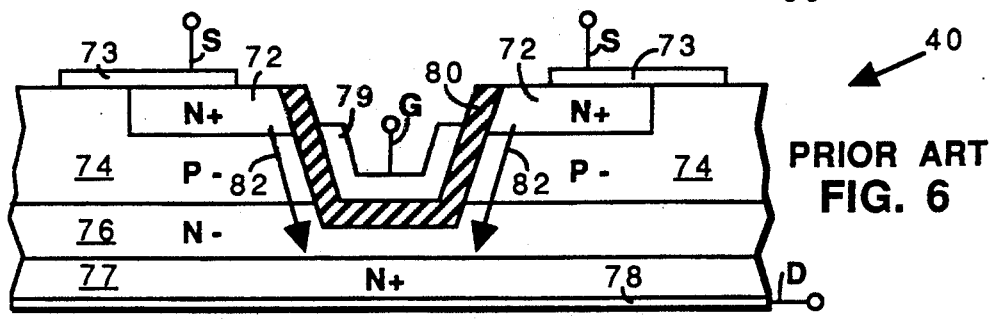

METHOD FOR FORMING A MOSFET WITH SUBSTRATE SOURCE CONTACT

FIELD OF THE INVENTION

This invention relates to semiconductor devices and, more particularly, to improved means and methods for high frequency and/or high power MOSFET devices.

BACKGROUND OF THE INVENTION

MOSFET devices are well known in the semiconductor art and there is an increasing desire to use MOSFET devices in RF applications because of their many favorable properties. However, a number of problems inhibit their widespread use in RF applications which require both high or very high frequencies and significant power output. For example, it is desirable in the RF art to use MOSFET devices in the grounded-source configuration, as illustrated for example in the equivalent device circuit of FIG. 1. In FIG. 1, MOSFET 10 has source connection 12 with parasitic impedance 13, drain connection 14 with parasitic impedance 15 and gate connection 16 with parasitic impedance 17. These parasitic impedances have a profound affect on the performance of the RF device in an amplifier or other circuit.

The geometric arrangement of the source, drain and gate connections on the semiconductor die affects the utility of the MOSFET for RF applications. For example, FIG. 2 shows prior art RF MOSFET die 19 installed in RF device package 20. MOSFET die 19 is typically mounted on metal layer 21 on dielectric spacer 22 on metallic heatsink flange 24 which is also the RF ground reference terminal. Wire bonds 26 connect the source bonding pad on the upper surface of MOSFET die 19 to grounded package flange 24 and bridge 28. Wire bonds 26 contribute to parasitic impedance 13. Bridge 28 is attached to or part of flange 24 and helps limit parasitic inductance 13. Wire bond 30 connects the gate bonding pad of die 19 to gate input lead 32 and wire bond 34 connects metal layer 21, which typically contacts the substrate drain connection of MOSFET die 19, to drain output lead 36. Wire bonds 30, 34 contribute to parasitic impedances 17, 15 respectively.

The geometries of various types of Prior art MOSFET die 40 are illustrated in FIGS. 3-6. FIG. 3 shows a lateral DMOS device comprising source 42 with source contact 43, drain 44 with drain contact 45, body 46 with more heavily doped region 47, and gate 48 on gate dielectric 49 for inducing lateral channel current flow 50 in body 46, 47. The source, drain and gate connections of the device of FIG. 3 are all on the top surface of the die and substrate contact 51 acts as a "back gate". FIG. 4 illustrates a further lateral device similar to that shown in FIG. 3 but with deep substrate contact 62 extending to highly doped substrate region 63 adjacent back-side contact 64.

FIG. 5 shows a prior art TMOS device comprising sources 52 with source contacts 53, drain region 54, 55 with drain contact 56, lateral diffused region 57 in which channels are formed under gate dielectric 59 by gate electrode 60. Channel current 61 flows first laterally through region 57 into drain region 54 and then vertically downward through the remainder of region 54 into back-side drain contact 55, 56.

FIG. 6 illustrates a prior art vertical MOSFET device configuration comprising source regions 72 with source electrodes 73 shorted to body region 74 overlying lightly doped drain region 76 and highly doped back-side drain contact region 77 and drain contact metallization 78. Gate 79 on gate dielectric 80 induces channel current 82 which flows substantially vertically downward from upper surface source regions 72 through body portion 74 into drain and drain contacts 76, 77, 78. FIGS. 5 and 6 show the typical prior art geometry of MOSFET die 40 most used for high power, high frequency RF applications and illustrated as die 19 in RF device package 20.

Wire bonds 26, 30, 34 of FIG. 2 significantly increase parasitic impedances 13, 15, 17 represented in the equivalent device circuit of FIG. 1. Parasitic impedance 13 appearing in the grounded source lead is particularly troublesome since it is degenerative and substantially degrades overall performance of packaged device 20. A common failing of prior art die designs, illustrated for example in FIGS. 3-6, is that the back-side contact to the semiconductor substrate is either a back-gate contact or the drain contact. In none of these device geometries is the source available as the back-side contact. Thus, in order to mount the MOSFET die in a grounded source package, insulator 22 and wire bonds 26 must be provided. These increase the parasitic electrical and thermal impedance and undesirably degrade the performance of the packaged device.

There is a continuing need for improved MOSFET device geometries which avoid or circumvent these and other limitations of the prior art. This need becomes more important as packaged devices capable of operating at higher and higher frequencies and/or higher and higher power levels are desired, for example, in the range of about $\geq 30$ MHz and $\geq 100$ watts, $\geq 100$ MHz and $\geq 10$ watts, $\geq 500$ MHz and $\geq 1$ watt, and $\geq 1000$ MHz and $\geq 0.1$ watt.

SUMMARY OF THE INVENTION

Accordingly, it is an object of the present invention to provide an improved means and method for MOSFETS having a back-side source contact. It is a further object to provide an improved means and method for MOSFETS which can be mounted in a grounded-source package without need for an insulator between the MOSFET die and the package flange. It is a still further object to provide an improved means and method for MOSFETS without need for source contact wirebonds. These improvements are especially intended for high frequency and/or high power MOSFETS although they are also useful at lower frequencies as well.

The foregoing and other objects and advantages are provided by a vertical MOSFET device comprising a semiconductor substrate having first and second opposed surfaces, a drain region adjacent the first surface, a channel forming (body) region underlying the drain region, a source region underlying the channel forming region and a gate dielectric and electrode on a portion of the channel forming region between the source and drain regions for modulating the conductivity therebetween, and a buried ohmic contact shorting part of the channel forming region to the underlying source region. The source region extends to or is contacted from the second surface.

The buried ohmic contact is desirably formed at the bottom of a first cavity extending from the first surface into the substrate to the source region and covered with a semi-insulator or dielectric. This first cavity desirably has a first sidewall portion adjacent the first surface which is substantially vertical and a second sidewall portion below the first sidewall portion which is inclined at an angle to that the PN junction between the channel forming region and the source region intersects the angled sidewall portion of the cavity. The PN junction is covered with a buried conductor which makes ohmic contact to the semiconductor on both sides of the PN junction, thereby locally shorting the two regions together. There is no need for this shorting conductor to extend to either surface of the device.

The drain region desirably comprises a lightly doped drift region abutting the channel forming region and a more heavily doped drain contact region abutting the drift region and extending to the first surface. A source electrode is provided on the second surface and a drain electrode on the first surface. The gate dielectric and superposed gate electrode are desirably formed on sidewalls of a second cavity extending from the first surface into the substrate to the source region. It is desirable that the portion of the cavity sidewalls extending through the drain region have a thicker insulator thereon to reduce parasitic gatedrain capacitance.

The foregoing structure is desirably formed by a method comprising: providing a semiconductor substrate having a first region of a first type and first conductivity extending to a first surface, a second region of the first type and a lower second conductivity underlying the first region, a third region of a second type opposite the first type and a third conductivity underlying the second region, and a fourth region of the first type and a fourth conductivity underlying the third region and extending to a second, opposite surface; forming one or more cavities extending into the substrate from the first surface, wherein first and second portions of the third region are exposed on sides of the one or more cavities and at least a first portion of the fourth region is also exposed; and then in either order, (i) forming a gate oxide on the first portion of the third region, and (ii) forming a non-rectifying connection between the first portion of the fourth region and the second portion of the third region. The method desirably further comprises forming a gate electrode on the gate oxide, a source electrode contacting the fourth region on the second surface and a drain electrode contacting the first region on the first surface.

It is desirable that the step of forming the one or more cavities comprises, (i) initially etching the one or more cavities by a first etch procedure to a first depth extending at least into the second region but not into the fourth region, and (ii) thereafter further etching the one or more cavities by a second, different etch procedure to extend substantially to the fourth region. The further etching step should produce sloping cavity sidewalls in at least in the lower portion of the cavity.

It is convenient that initial etching step comprises anisotropic etching and the further etching step comprises orientation selective etching. In addition, it is desirable to form a dielectric isolation wall laterally surrounding the one or more cavities. The isolation wall may be provided before, during or after forming the one or more cavities.

The present invention will be more fully understood by reference to the accompanying drawings and descriptions thereof provided below. For convenience, the notation "xEy" is adopted for numbers involving exponents. Thus, $1E16 = 1 \times 10^{16}$, $2.3E-7 = 2.3 \times 10^{-7}$, $7E14 = 7 \times 10^{14}$, etc. Such notation is well known and understood in the art.

BRIEF DESCRIPTION OF THE DRAWINGS

FIG. 1 is an electrical schematic representation of a prior art MOSFET including parasitic impedances;

FIG. 2 is a simplified side and partially cut-away view of a packaged RF MOSFET according to the prior art;

FIGS. 3-6 are simplified and schematic cross-sectional views of MOSFET die according to the prior art;

DETAILED DESCRIPTION OF THE DRAWINGS

In FIGS. 7-8 and 10-22, typical doping of various device regions is indicated. This is merely for convenience of explanation and is not intended to be limiting.

Figure 7:
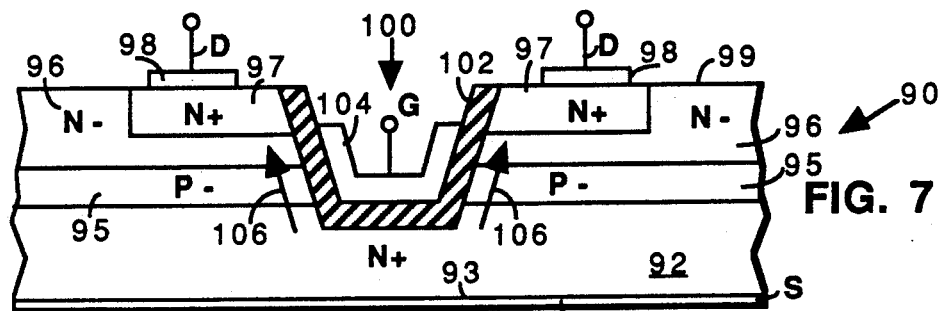
FIGS. 7-8 are simplified and schematic cross-sectional views of MOSFET die, similar to FIGS. 3-6, but according to the present invention.

FIG. 7 is a simplified cross-sectional view of MOSFET die 90 having back-side source contact 94, according to a first embodiment of the present invention. MOSFET die 90 comprises source region 92 with metallic source connection 94 on die back-side 93, body portion 95, and drain region 96, 97 comprising lightly doped drain drift region 96 and heavily doped drain contact region 97 with metallic drain connection or electrode 98 on front or top-side 99 of die 90. Cavity 100 extends into device 90 from top-side 99 to heavily doped source region 92 adjacent back-side 93. Gate dielectric 102 is provided on the sidewalls of cavity 100 on body region 95. Gate electrode 104 lies on gate dielectric 102 facing body portion 95 so as to invert the sidewall Portions of body region 95 to allow upward directed channel current flow 106 from source 92 to drain 96, 97. Regions 97, 96, 95, 92 are desirably doped, respectively, N+, N, P, N+ or N+,N−, P−, N+ or the inverse thereof, that is, with N and P reversed. Stated more generally, regions 97, 96, 95, 92 are desirably doped, respectively, A+, A, B, A+ or A+,A−, B−, A+ or A+, A−, B, A+ or A+, A, B−, A+, where A may be either P or N type and B is the opposite type.

While the device of FIG. 7 provides a die structure suitable for convenient installation in a grounded source package, it suffers from the limitation that there is no ohmic connection to body region 95. Accordingly, a high impedance will exist between the reference terminal, e.g., the source, and channel 106. The produces a long time constant for charging the capacitance of gate dielectric 102, resulting in relatively poor high frequency response. This deficiency is overcome by the arrangement of FIG. 8.

Figure 8:
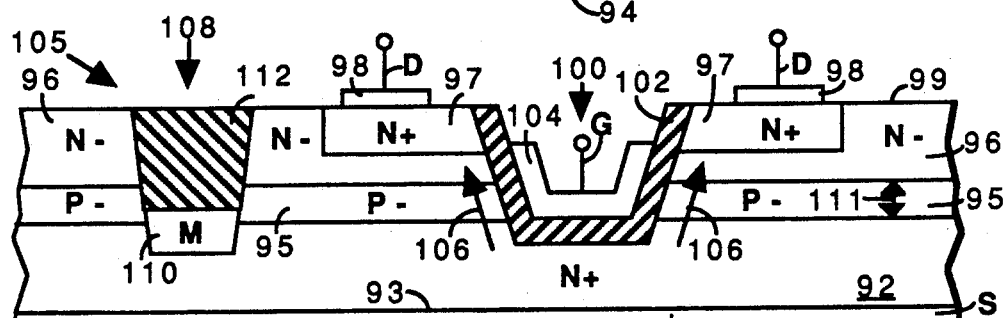

MOSFET die 105 of FIG. 8 is similar to MOSFET die 90 of FIG. 7 but with the addition of supplementary cavity region 108 in which is provided ohmic contact 110 connecting source region 92 with body region 95.

Ohmic contact 110 may be a metal, as for example, Al, Ti, W, Mo, Ta, Ni, Cr, Pt or alloys of these and other metals, or an intermetallic formed by reaction of these or other metals with the semiconductor substrate or a degenerate semiconductor or other electrically conductive materials. All that is required is that conductor 110, indicated by the general symbol "M" in FIG. 8 (and FIGS. 18–20 and 22) form an ohmic connection between N+ region 92 and P or P− region 95 sufficient to permit rapid charging and discharging of channel 106 and be sufficiently resistant to temperature to withstand the highest temperature necessary to complete fabrication of die 105 after metal 110 is formed in cavity 108. As used here, the words "conductor" or "metal" or "metals" and the symbol "M" in connection with this ohmic connection are intended to include substantially pure metals, alloys of metals, degenerate semiconductors, intermetallics formed by reaction of metals with semiconductors, combinations thereof, and other compatible electrically conductive materials. Nonlimiting examples of suitable intermetallics and/or alloys are PtSi, TiN, AlSi, AlCu, AuGe, and TiW. Conductor 110 is desirably covered with semi-insulating, high resistance or dielectric material 112, as for example, oxide, nitride, glass, polysilicon and/or mixtures thereof.

The structure of FIG. 8 provides power MOSFET die 105 whose channel length is determined primarily by thickness 111 of body region 95, taking into account the sidewall angle of cavity 100 in region 95, and a channel width determined by the lateral perimeter of cavity 100 in region 95 when viewed looking into cavity 100 from above surface 99. Because thickness 111 and the lateral dimensions of cavity 100 can be easily controlled, power MOSFETS of high gain and large power handling capacity can be readily constructed.

Figure 9:
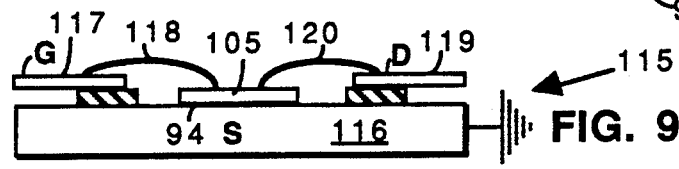
FIG. 9 is a simplified side and partially cut-away view of a packaged RF MOSFET, similar to FIG. 2, but according to the present invention.

Since the source connection in die 105 is via back-side metallization 94 on rear face 93 of die 105, a low impedance electrical and thermal connection may be made from source contact 94 to the thermal heatsink and electrical ground flange of the package. This is illustrated in FIG. 9 which is a simplified cross-sectional and cut-away view of power MOSFET die 105 of FIG. 8 mounted in RF device package 115, analogous to package 20 of FIG. 2. Source contact metal 94 of die 105 is attached to metal heatsink and ground flange 16, typically by solder or eutectic bonding. Gate metallization 104 on die 105 is connected to gate input lead 17 by wire bond 118 and drain metallization 98 on die 105 is connected to drain output lead 119 by wire bond 120.

No source wire bonds are required because source metallization 94 is attached directly to flange 116. This provides the lowest parasitic electrical inductance and resistance in the source circuit. Further, the thermal impedance associated with isolation dielectric 22 (see FIG. 2) is eliminated so the junction to case thermal impedance of packaged device 115 is also reduced.

Other things being equal, device package 115 (see FIG. 9) is much more compact than device package 20 (see FIG. 2) because it is no longer necessary to leave room on flange 116 to accommodate source wire bonds 26 or bridge 28 as in the prior art. Accordingly, the gate and drain wire bonds can now also be made shorter. Thus, the parasitic impedances of all of the device leads of the packaged MOSFET die are reduced and the high frequency performance is correspondingly improved. These are particular features of the present invention.

FIGS. 10–22 are simplified and schematic die cross-sections or the MOSFET of the present invention during different stages of manufacture and according to several embodiments. While the formation of the invented device is described in terms of providing layers or regions of particular conductivity and type, those of skill in the art well understand that this is merely for convenience of explanation and not intended to be limiting and that useful devices are obtained by substituting materials of opposite type and that differing conductivities can also be used.

Figure 10:
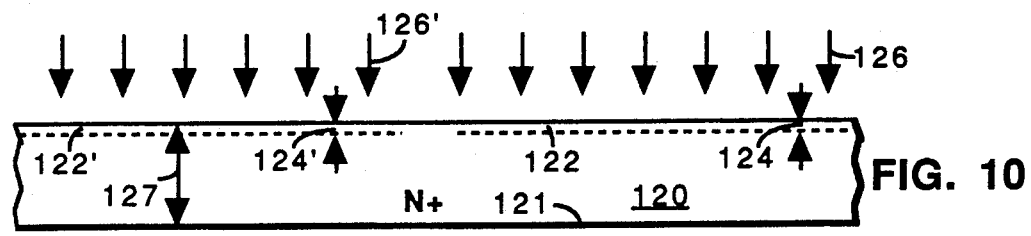
FIGS. 10-20 are simplified and schematic cross-sectional views of MOSFET die according to a first embodiment of the present invention, at various stages of fabrication.

Referring now to FIG. 10, highly doped (e.g., $N+ \geq 1E19/cm^3$ phosphorous or arsenic doped silicon) substrate 120 of thickness 127 (e.g., 0.25–0.75 mm depending on the wafer diameter) is provided. Substrate 120 has backside 121.

The surface of substrate 120 opposite backside 121 is desirably but not essentially doped in regions 122, 122' with impurities of the opposite conductivity type (e.g., boron) to a depths 124, 124'. This is conveniently accomplished by ion implantation as indicated by arrows 126, 126', but other doping methods well known in the art may also be used. It is desirable but not essential to perform different implantations in the portion of the die that will contain the MOSFET channel and the portion of the die that will contain the buried source-body short. For example, a light implant, e.g., about $5E13/cm^2$ boron+ at 50 KeV, is conveniently provided as indicated by arrows 126 to partially counter-doped region 131 in the right half of FIG. 10 where the MOSFET will eventually be located. A heavier implant, e.g., about $5E15/cm^2$ boron+ at 50 KeV, is conveniently provided as indicated by arrows 126' to more strongly counter dope region 131' in the left half of FIG. 10 where the source-body short will eventually be located. The function of these implants is discussed more fully in connection with the discussion of FIG. 11. It is desirable to anneal any implant damage so that substantially defect free epitaxial layers may be formed on substrate 120.

Figure 11:
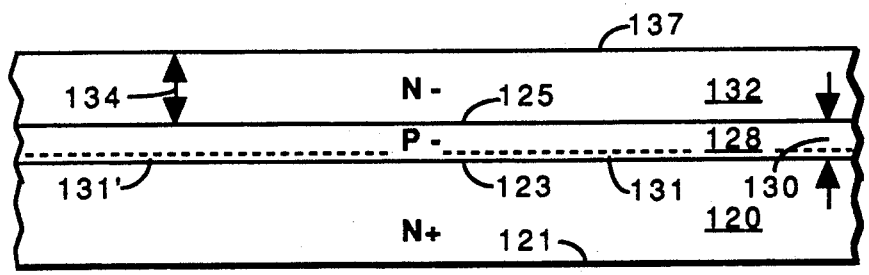

Referring now to FIG. 11, comparatively lightly doped layer or region 128 (e.g., P or P−) of thickness 130 is provided on substrate 120 forming PN junction 123 therewith. Implant atoms 126, 126' in substrate 120 will diffuse partly into layer 128 during formation thereof and provide regions 131, 131' of enhanced P-doping adjacent PN junction 123. It is desirable that the implant dose provided in substrate 120 to form doped region 122' and 131' be sufficient to render region 131' comparatively highly doped, e.g.,P+, since this facilitates forming ohmic contact to P region 128. It is desirable that the implant dose in substrate 120 to form doped regions 122 and 131 be less than that for regions 122', 131', but sufficient to provide a local doping gradient in region 128 where the MOSFET is to be located. This is helpful in adjusting the threshold voltage of the MOSFET. While doped regions 131, 131' are helpful, they are not essential.

Comparatively lightly doped layer or region 132 (e.g., N or N−) of thickness 134 is provided on region 128, forming PN junction 125 therewith. Layer 128 is of opposite type to substrate 120 and layer 132 is the same type as substrate 120 but more lightly doped. Layers or regions 128 and 132 are conveniently but not essentially provided by epitaxial growth using means well known in the art. Other well known techniques for forming semiconductor regions of differing conductivity and type can also be used.

Thickness 130 of layer or region 128 substantially determines the channel length of the finished MOS- FET. Typical values for thickness 130 suitable for high frequency and high power MOSFETS are 1–3 micrometers, but larger and smaller values can also be used. Suitable average doping densities for layer 128 are in the range of about $5E16-5E17/cm^3$, depending on the desired threshold voltage. While it is convenient to provide locally enhanced doping in layer 128 adjacent junction 123 by implanting substrate 120 before forming layer 128, the locally enhanced doping may also be obtained by varying the doping during formation of layer 128. However, this requires greater control over the epitaxial growth process for layer 128.

The doping density and thickness 134 of region 132 substantially determine the breakdown voltage of the finished MOSFET. Suitable combinations of doping and thickness for layer 132 are about $6E15/cm^3$ and about 3 micrometers for about 50 volt breakdown and about $1E14/cm^3$ and about 25 micrometers for about 500 volts breakdown, but other values can also be used. Those of skill in the art will understand, based on the description herein, how to choose the doping and thickness of layers 128 and 132 to arrive at the desired device properties.

Figure 12:
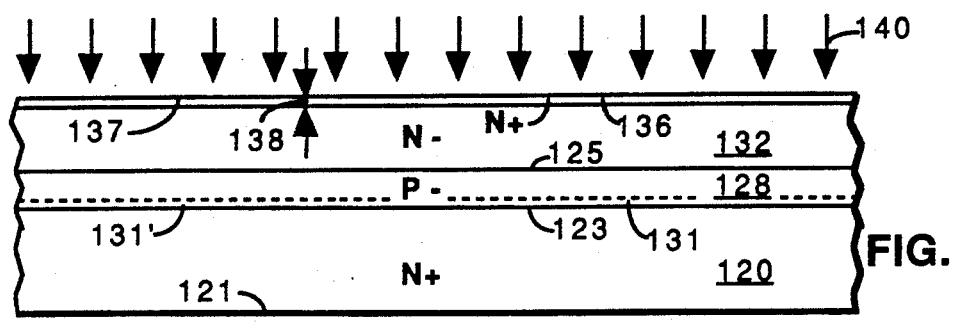

Referring now to FIG. 12. heavily doped layer 136 (e.g., N+) of thickness 138 is now formed in or on layer 132. This is most conveniently accomplished by ion implantation 140, but diffusion or epitaxial growth may also be used. Thickness 138 is typically small compared to thickness 134 of layer 132, e.g., 0.1–0.5 micrometers, but larger or smaller values can be used. Implant doses of about $\geq 1E16/cm^2$ are suitable. No masking of implant 140 is required at this stage of the process, but it is not precluded. Further, while it is convenient to form (e.g., N+) region 136 at this stage in the process, it is not essential. Heavily doped surface region 136 may be formed at any later step where the temperatures necessary to introduce dopant 140 into the semiconductor and/or anneal any doping damage will not disturb previous process steps. Those of skill in the art will understand, depending for example on the temperature tolerance of the passivation, metallization and/or other materials, how to choose the most desirable point in the fabrication sequence for providing doped region 136.

Figure 13:
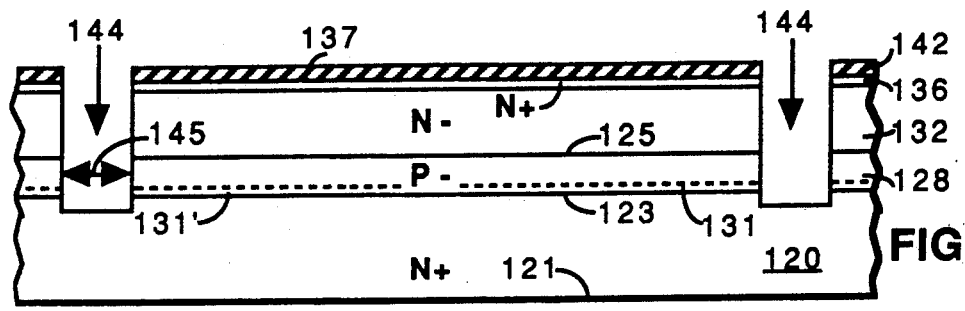
Figure 14:
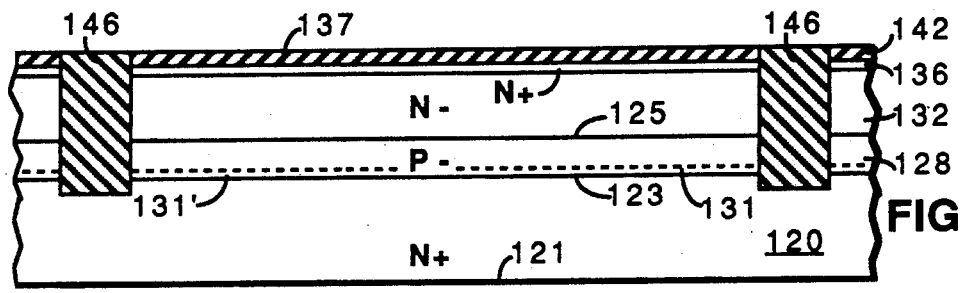

Referring now to FIG. 13, masking layer 142 is provided on upper surface 137 of layer 136. Silicon oxide, silicon nitride and/or combinations thereof are suitable for masking layer 142, but other materials such as for example, photoresist or polyimide may also be used. It is desirable, but not essential to form lateral boundary trench 144 of width 145 surrounding the region intended to contain the MOSFET. As shown in FIG. 14, trench 144 is then filled with material 146 (e.g., dielectric or semi-insulating poly and/or a combination thereof) to provide lateral isolation of the MOSFET. Width 145 is typically in the range of 1–15 micrometers, with 2–10 micrometers being preferred, but larger or smaller values may also be used. Means and methods for providing masking layer 142 and forming and filling trench 144 are well known in the art.

Figure 15:
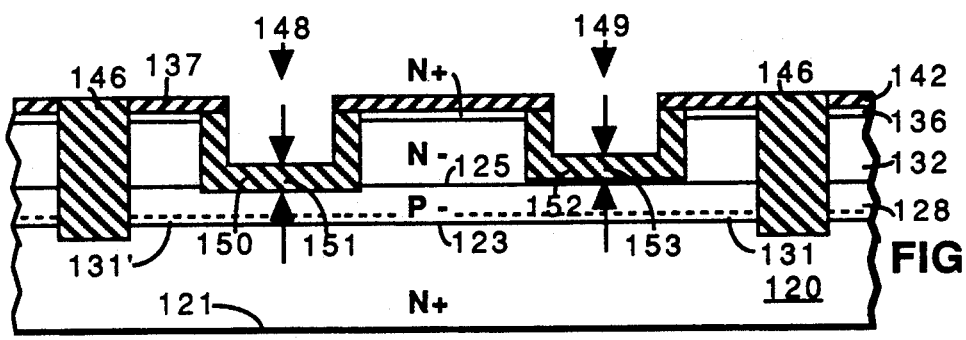

Referring now to FIG. 15, additional openings are provided in masking layer 142 and trenches 148, 149 are etched from surface 137 through region 136 and into layer or region 132.

Trenches 148, 149 are typically about 1–15 micrometers wide, with about 2–10 micrometers being preferred, but larger or smaller values may also be used. Means and methods for etching such trenches are well known in the art. Anisotropic plasma etching is a preferred method and is well known in the art. Other well known methods may also be used.

The semiconductor exposed on the sidewalls and bottoms of trenches 148, 149 is then treated to provide dielectric 150 of thickness 151 in trench 148 and dielectric 153 of thickness 153 in trench 149. Thermal oxidation is a convenient means of forming dielectrics 150, 152, but other techniques well known in the art can also be used. CVD or LPCVD are suitable examples. The semiconductor at the bottoms of dielectric coated trenches 148, 149 should be approximately even with interface 125 between regions 132 and 128. It is desirable that the bottom of trench 148 be slightly deeper than the bottom of trench 149 and extend slightly below interface 125 into region 132, while the bottom of trench 149 is slightly above interface 125. This can be accomplished by masking trench 149 during a portion of the etch or oxidation steps. Means and methods for masking etch and/or oxidation are well known in the art.

Figure 16:
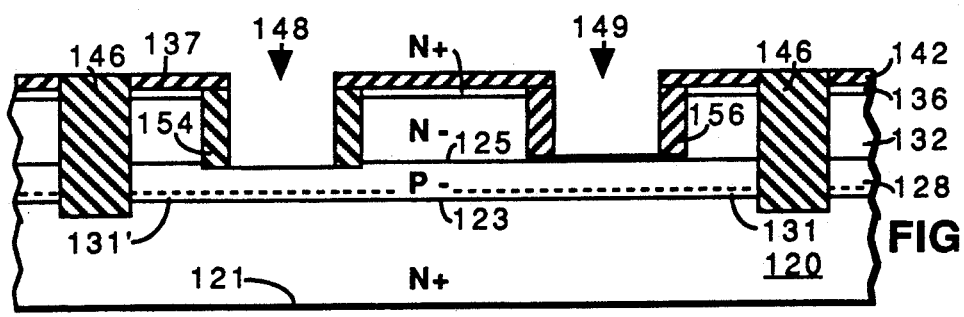
Figure 17:
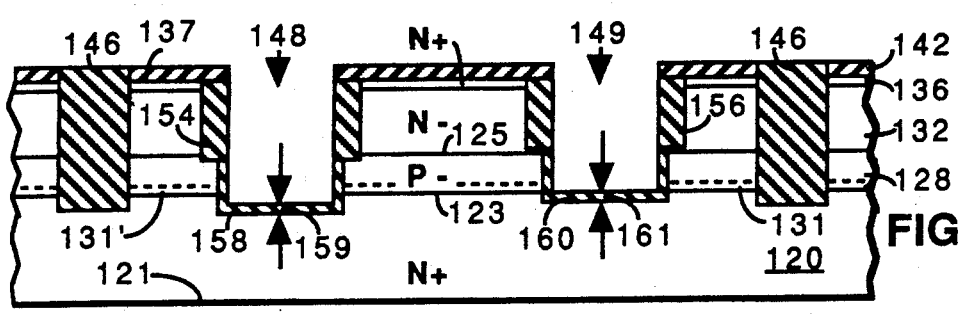

As shown in FIG. 16, dielectric 150 on the bottom of trench 148 and dielectric 152 on the bottom of trench 149 are then removed, for example by anisotropic etching, so as to leave sidewall portion 154 of dielectric 150 and sidewall portion 156 of dielectric 152, respectively, in place in trenches 148, 149. Trenches 148, 149 are then further etched as shown in FIG. 17, using for example substantially the same method as for the initial etch of trenches 148, 149, to increase their depth. The freshly exposed semiconductor surfaces of trench 149 are coated with further dielectric 160 of thickness 161. The freshly exposed semiconductor surfaces in trench 148 may also be coated with dielectric 158 of thickness 159, but this is not essential since dielectric 158 will be subsequently removed. Thicknesses 159, 161 are desirably less than thicknesses 151, 153. Dielectric 160 can be used as the gate dielectric of the MOSFET and should be of high quality. Dielectric 158 is not essential and may omitted, but formation thereof at the same time as the formation of dielectric 160 does no harm.

Figure 18:
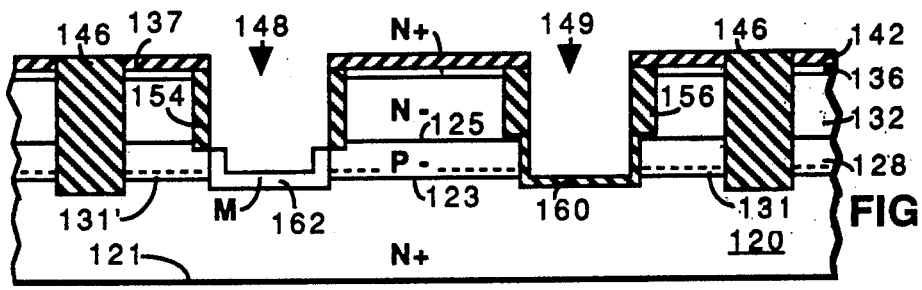

Referring now to FIG. 18, dielectric 158 (if any) is removed, as for example by a dip etch while dielectric 160 is protected, and conductor 162 formed on the freshly exposed portions of regions 120 and 128 in the bottom of trench 148. Dielectric 160 is desirably masked during this operation, although it may also be formed after formation of conductor 162. Either arrangement suffices.

Conductor 162 must make an ohmic (non-rectifying) contact to both regions 120 and 128 so as to provide a local short across PN junction 123. Making an ohmic contact to lightly doped region 128 is facilitated by more heavily doped region 131' provided earlier. More heavily doped region 131' also reduced the spreading resistance associated with the ohmic contact to region 128.

It is desirable to form conductor 162 by selective deposition or reaction, that is, by deposition or reaction on exposed semiconductor surfaces but not on exposed dielectric surfaces. For example, conductor 162 may be formed by depositing Pt over the entire surface of the wafer, including the fresh semiconductor surface exposed in the bottom of trench 148, mask layer 142 on surface 137, and on sidewall oxides 154, 156, and 160. The Pt initially adheres to all surfaces, but when heated it reacts with the exposed semiconductor to form an intermetallic compound capable of forming ohmic contacts to P region 128 and N region 120, and does not react with the dielectric layers. The Pt on the dielectric layers is then etched away while the PtSi, for example, formed on the exposed silicon in the bottom of trench 148 is not attacked by the etching reagent and remain behind. Thus, conductor 162 may be formed by this method without need for any additional masking steps. This is particularly convenient and is preferred. While Pt or PtSi are examples of materials suitable for use for conductor 162, other conductors capable of forming ohmic contacts to regions 128 and 132 may also be used. Examples thereof have been given above in connection with the discussion of FIG. 8.

Figure 19:
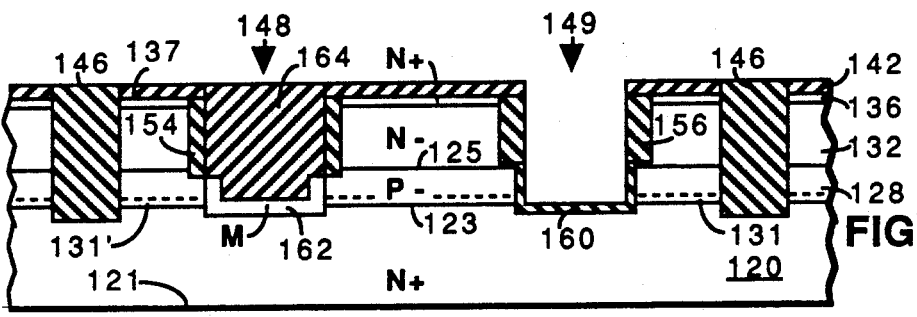

Trench 148 is then desirably filled with dielectric or semi-insulating material 164 and planarized using means well known in the art (see FIG. 19). Oxide, nitride, glasses, polycrystalline semiconductor, organic compounds and combinations thereof are examples of suitable materials.

Figure 20:
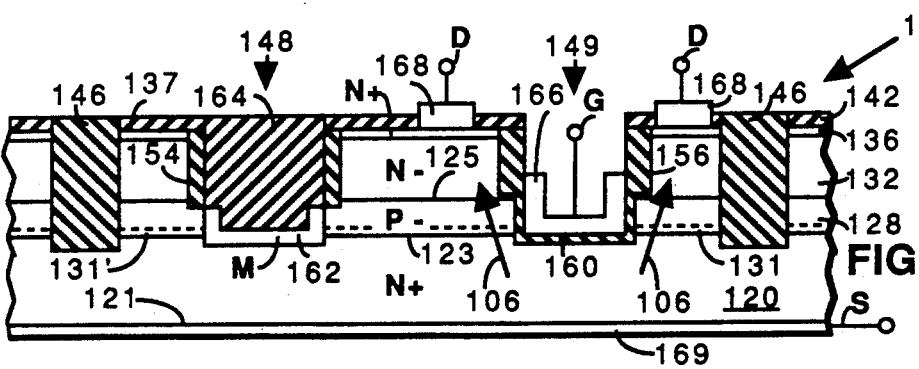

Referring now to FIG. 20, gate metallization 166 is provided on gate dielectric 160 and drain metallization 168 is provided on surface 137 in contact with highly doped region 136. Source metallization 169 is provided in contact with region 120 on die back-side 121. This forms MOSFET 170 having back-side source region 120 connected to body region 128 by internal buried ohmic short 162 and with top-side gate and drain connections 166, 168, and which is suitable for use as MOSFET die 105 in package 115 of FIG. 9, and which provides substantially vertically upward flowing channel current 106 from back-side source 120 to top-side drain 168. It is desirable to thin substrate 120 by mechanical shaping before applying source metallization layer 169.

N+ region 136 has been shown as being unmasked since it is automatically separated into discrete portions by filled trench 146 and trenches 148, 149. Thus, multiple devices may be made on the same wafer or die without having the drains tied together, although that is not precluded. However, use of an unmasked doping step for forming region 136 is not essential, and region 136 may be localized by masking. The latter is desirable where isolation wall 146 is omitted. Drain regions 136 would then have a lateral geometry similar to source regions 72 of FIG. 6.

Figure 21:
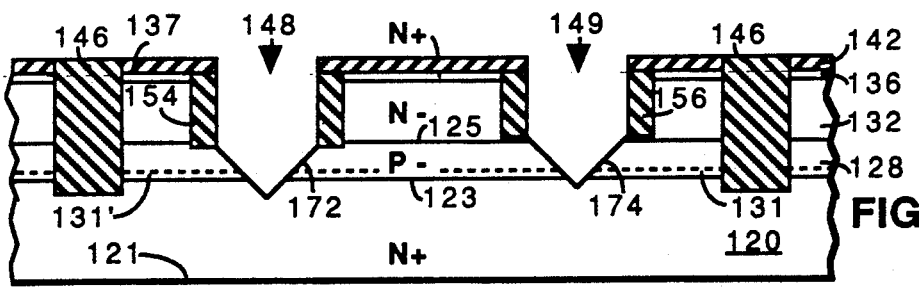
FIGS. 21-22 are simplified and schematic cross-sectional views of MOSFET die at various stages of fabrication and similar to FIGS. 18-19, but according to a further embodiment of the present invention.
Figure 22:
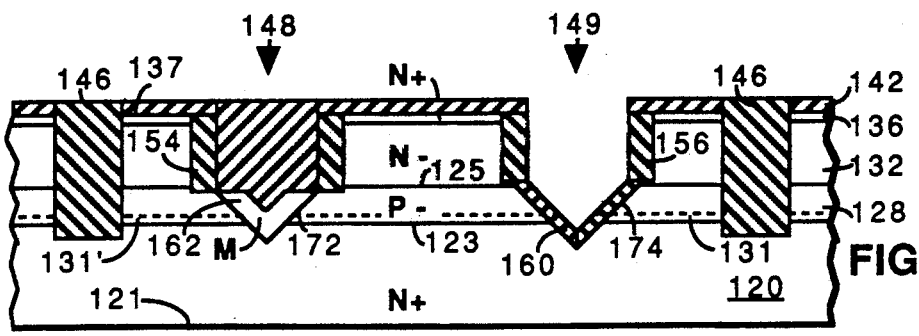

FIG. 21–22 illustrate a further embodiment of the steps previously described in connection with FIGS. 16–19. The process in substantially the same as previously described through the stage represented by FIG. 16. Then, instead of performing the second etch of trenches 148, 149 using, for example, the same general kind of anisotropic etch as was used for the initial etch step in FIGS. 14–16, an orientation selective etch is used to extend trenches 148, 149 to substrate 120. Orientation selective etches are well known in the art and provide trenches having sidewalls that make predetermined angles with the plane of the crystal lattice and crystal surface. This produces "V-shaped" sidewalls 172, 174 in the bottom of trenches 148, 149 as shown in FIG. 20.

While orientation selective etching is a particularly convenient way of obtaining angled sidewalls near the trench bottom, any method which produces angled or sloped sidewalls is useful. What is important is having lower portions 172, 174 of the trench sidewalls angled or sloped so that PN junction 123 between regions 120 and 128 intersects angled or sloped sidewalls 172, 174 and is visible from above when looking toward surface 137 into trenches 148, 149. This is a great manufacturing convenience since it provides a means for visually determining when etching of trenches 148, 149 has reached the proper depth at which some portion of region 120 is exposed in the bottom of trench 148 to form the ohmic contact with metal 162. It is also desirable that some small portion of substrate 120 also be exposed in the bottom of trench 149 so that gate 166 on oxide 160 extends at least to source 120. FIG. 22 illustrates the situation analogous to FIG. 19 in which conductor 162 has been formed in the bottom of trench 148 and gate oxide 160 has been formed on the sidewalls of trench 149 on body region 128 and on substrate 120. The structure of FIG. 22 is then completed in the same fashion depicted in FIG. 20.

Having thus described the present invention, it will be apparent to those of skill in the art that the invented structure and method provides a back-side MOSFET particularly adapted for use where grounded source arrangements are desired, as for example, in high frequency and/or high power RF applications. It will be further apparent that the invented arrangement provides die which facilitate a particular compact RF packaged devices having lower parasitic thermal and electrical impedances and improved performance. It will also be apparent that devices having very short channel lengths, fast response, high gain, and high breakdown voltages are provided by the invented means and method.

Those of skill in the art will also understand based on the explanation herein that the invented structure and method may be applied to other combinations of P and N regions and to other semiconductor materials besides silicon and that other metals and dielectrics may be used in its construction beside those mentioned, and that the trenches while illustrated as sometimes having tapered or vertical sidewalls may have either, and further that the trenches while described as being etched in two stages may be formed to substantially their final depth in a single step and that while two trenches have been illustrated, one for the source-body short and another for the gate region, that these may be combined in a single trench wherein one sidewall is used for the gate region and a portion of the bottom and another sidewall contains the source-body short. Accordingly, it is intended to include these and other variations as will occur to those of skill in the art based on the teachings herein in the claims that follow.

We claim:

1. A method for forming a semiconductor device comprising:
   providing a semiconductor substrate having a first region of a first type and conductivity extending to a first surface, a second region of the first type and a lower second conductivity underlying the first region, a third region of a second type opposite the first type and a third conductivity underlying the second region, and a fourth region of the first type and a fourth conductivity underlying the third region and extending to a second, opposite surface;
   forming a cavity extending into the substrate from the first surface, wherein first and second portions of the third region are exposed, respectively, on sides of the cavity and a first portion of the fourth region is also exposed in the cavity; and
   then in either order, (i) forming a gate oxide on the first portion of the third region, and (ii) forming a nonrectifying connection between the first portion of the fourth region and the second portion of the third region in the cavity.

2. The method of claim 1 further comprising forming a gate electrode on the gate oxide, a source electrode contacting the fourth region on the second surface and a drain electrode contacting the first region on the first surface.

3. The method of claim 1 wherein the step of forming the cavity comprises, (i) initially etching the cavity by a first etch procedure to a first depth extending at least into the second region but not into the fourth region, and (ii) thereafter further etching the cavity by a second, different etch procedure to extend substantially to the fourth region.

4. The method of claim 3 wherein the initially etching step comprises anisotropic etching and the further etching step comprises orientation selective etching.

5. A method for forming a semiconductor device, comprising:

forming a semiconductor substrate having superposed, regions of conductivity and type represented by A+/A/B/A+ where A=N or P type and B=the opposite type, extending between opposed top and bottom surfaces, respectively;

forming a cavity extending from the top surface substantially through the A+/A/B regions; and forming, in a first portion of the cavity, a buried ohmic contact between the B/A+ regions and, in a second portion of the cavity, a gate oxide on the B region.

6. The method of claim 5 further comprising refilling the portion of the cavity over the ohmic contact.

7. The method of claim 6 further comprising forming a gate electrode on the gate oxide and a source contact to the bottom A+ region and a drain contact to the top A+ region.

8. The method of claim 5 wherein the the step of forming a buried ohmic contact comprises forming a metal or intermetallic contact to the B/A+ regions exposed in the cavity.

9. The method of claim 8 wherein the buried ohmic contact is formed by selective deposition of a metal followed by a heating step to form a reaction product of the metal with the semiconductor.

10. The method of claim 4 further comprising providing a dielectric isolation wall laterally surrounding the cavity.

* * * * *